United States Patent
Desko et al.

(10) Patent No.: US 6,790,753 B2
(45) Date of Patent: Sep. 14, 2004

(54) FIELD PLATED SCHOTTKY DIODE AND METHOD OF FABRICATION THEREFOR

(75) Inventors: John Charles Desko, Wescosville, PA (US); Michael J Evans, Royersford, PA (US); Chung-Ming Hsieh, Wyomissing, PA (US); Tzu-Yen Hsieh, Wyomissing, PA (US); Bailey R Jones, Lenhartsvill, PA (US); Thomas J. Krutsick, Fleetwood, PA (US); John Michael Siket, Jr., West Lawn, PA (US); Brian Eric Thompson, Sinking Spring, PA (US); Steven W. Wallace, Fleetwood, PA (US)

(73) Assignee: Agere Systems Inc, Allentown, PA (US)

( * ) Notice: Subject to any disclaimer, the term of this patent is extended or adjusted under 35 U.S.C. 154(b) by 0 days.

(21) Appl. No.: 10/696,136

(22) Filed: Oct. 29, 2003

(65) Prior Publication Data

US 2004/0089908 A1 May 13, 2004

Related U.S. Application Data

(62) Division of application No. 09/653,616, filed on Aug. 31, 2000, now Pat. No. 6,690,037.

(51) Int. Cl.⁷ .......................... H01L 21/28; H01L 21/44
(52) U.S. Cl. ........................................................ 438/578
(58) Field of Search .................................. 438/237, 578; 257/109–112, 155, 156, 471–486

(56) References Cited

U.S. PATENT DOCUMENTS

| | | | | |
|---|---|---|---|---|
| 3,694,719 A | * | 9/1972 | Saxena | 257/484 |
| 4,717,679 A | * | 1/1988 | Baliga et al. | 438/237 |
| 4,760,035 A | * | 7/1988 | Pfleiderer et al. | 438/200 |
| 5,258,640 A | * | 11/1993 | Hsieh et al. | 257/471 |
| 5,889,383 A | * | 3/1999 | Teich | 320/107 |
| 6,403,452 B1 | * | 6/2002 | Murakoshi et al. | 438/510 |

FOREIGN PATENT DOCUMENTS

| | | | | |
|---|---|---|---|---|
| JP | 362269359 A | * | 11/1997 | H01L/29/48 |

* cited by examiner

Primary Examiner—David S. Blum

(57) ABSTRACT

A Schottky diode is fabricated by a sequence of fabrication by a sequence of fabrication steps. An active region of a semiconductor substrate is defined in which a Schottky diode is fabricated. At least first and second layers of insulating material are applied over the active area. A first layer of insulating material, having a first etching rate, is applied over the active area. A second layer of insulating material having a second, greater, etch rate is applied over the first layer of insulating material to a thickness that is about twice the thickness of the first layer of insulating material. The insulating material is patterned and a window is etched through the layers of insulating material to the semiconductor substrate. Metal is applied and unwanted metal is etched away leaving metal in the window forming a Schottky contact therein. One or more barrier layers may be employed.

15 Claims, 3 Drawing Sheets

FIELD PLATED SCHOTTKY DIODE AND METHOD OF FABRICATION THEREFOR

This application is a division of Ser. No. 09/653,616 filed Aug. 31, 2000 now U.S. Pat. No. 6,690,037.

TECHNICAL FIELD

This invention relates to Schottky diodes and methods for their fabrication, and in particular to a Schottky diode having improved reverse bias characteristics.

BACKGROUND OF THE INVENTION

A Schottky diode is fabricated by placing metal in contact with a light-to-moderately doped n-type semiconductor material. The resulting metal-semiconductor junction operates like a diode, conducting current in one direction (from the metal anode to the semiconductor cathode) and functioning as an open-circuit in the opposite direction.

Schottky diodes are used widely in electronic systems such as amplifiers, receivers, control and guidance systems, power and signal monitors, and as rectifiers and clamps in RF circuits. Commercial applications include radiation detectors, imaging devices, and wired and wireless communications products. High frequency Schottky diodes may be GaAs devices, and frequently are discrete devices.

The voltage-current characteristics of Schottky diodes are very similar to the voltage-current characteristics of p-n junction diodes, with two exceptions. Firstly, in a Schottky diode forward current is conducted by majority carriers (electrons). Under moderate forward bias conditions, minority carriers have a negligible role in operation of a Schottky diode. Thus Schottky diodes do not exhibit minority-carrier charge-storage effects found in forward biased p-n junctions and which gives rise to the diffusion capacitance of a p-n function diode. As a result, Schottky diodes can be switched from one state to another, either from on to off or from off to on much faster that p-n junction diodes.

Secondly, the forward voltage drop of a conducting Schottky diode is lower than the forward voltage drop of a p-n junction diode fabricated in the same semiconductor material for a given current. For example, a Schottky diode fabricated in silicon exhibits a forward voltage drop in the range of 0.3 to 0.5 volts, compared to a silicon p-n junction diode which exhibits a forward voltage drop in the range of 0.6 to 0.8 volts. When manufactured in gallium arsenide, Schottky diodes exhibit a forward voltage drop of about 0.7 volts.

Unguarded Schottky diodes typically have poor reverse leakage and poor breakdown characteristics. To improve leakage characteristics, high performance Schottky diodes are provided with junction guard rings. Guard rings provide excellent breakdown characteristics in both forward and reverse bias. Conventional junction guarded Schottky diode structures are fabricated by implanting a ring-shaped p-n junction in the semiconductor, typically silicon, forming an oxide surface layer by oxide growth and or deposition, opening a window in the oxide layer, and blanket depositing the Schottky barrier metal. Variations on this method have been proposed, but typically they create the guard ring prior to forming the Schottky metal contact. The guard ring introduces minority-carrier charge storage resulting in a slower switching of the Schottky diode. See for example U.S. Pat. Nos. 3,694,719 and 4,607,270.

A gated guard ring structure for a Schottky diode is disclosed in copending U.S. patent application Ser. No. 09/551,050 filed Apr. 18, 2000, entitled Self Aligned Gated Schottky Diode Guard Ring structures, the disclosure of which is hereby incorporated by reference. The gated guard ring structure provides an effective means of fabricating the gated Schottky diode using a self-aligned gate process. The portion of the substrate under the metal oxide semiconductor gate inverts when a bias is applied to the anode of the Schottky diode. Inversion of the substrate effectively forms an extension of the guard ring at low reverse bias so that the depletion layer between the p-n junction guard ring and the Schottky junction forms before sharp edge breakdown of the Schottky junction. Under forward bias conditions, the substrate under the metal oxide semiconductor gate is biased into accumulation, effectively removing the influence of the guard ring. While the resulting Schottky junction provides improved operation, a trade-off is made in that there are several additional steps to fabricate the Schottky diode.

U.S. Pat. No. 3,694,719 teaches a Schottky diode having metal deposited over an insulating material that has two thicknesses. The insulating material is stepped from an outer region away from the metal-semiconductor junction that is thicker to an inner region surrounding the metal-semiconductor Schottky junction that is thinner. Two methods are taught to achieve stepped thicknesses of the insulating material. The first method teaches a separate etch step to etch the thick layer of insulating material down to the desired thickness of the thinner inner region.

The second method teaches completely removing the portion of the insulating layer over the area of the semiconductor body surface within the guard ring to expose an area of the semiconductor body surface. Subsequently, the exposed area of the semiconductor body surface is recoated to the desired thickness with a thinner layer of the insulating material. An opening to the semiconductor body surface is then formed in the thinner layer of the insulating material, leaving a perimeter of the thinner layer surface of insulating material.

What is needed is a Schottky diode and method of fabricating a Schottky diode that retains the improved operation of known gated Schottky diodes but can be fabricated in fewer processing steps.

SUMMARY OF THE INVENTION

In accordance with the invention, a Schottky diode is fabricated by a sequence of fabrication steps. An active region of a semiconductor substrate is defined in which a Schottky diode is fabricated. At least first and second layers of insulating material are applied over the active area. A first layer of insulating material, having a first etching rate, is applied over the active area. A second layer of insulating material having a second, greater, etch rate is applied over the first layer of insulating material to a thickness that is about twice the thickness of the first layer of insulating material. The insulating material is patterned and a window is etched through the layers of insulating material to the semiconductor substrate. Metal is applied and unwanted metal is etched away leaving metal in the window forming a Schottky contact therein. One or more barrier layers may be employed.

DETAILED DESCRIPTION

Figure 6:
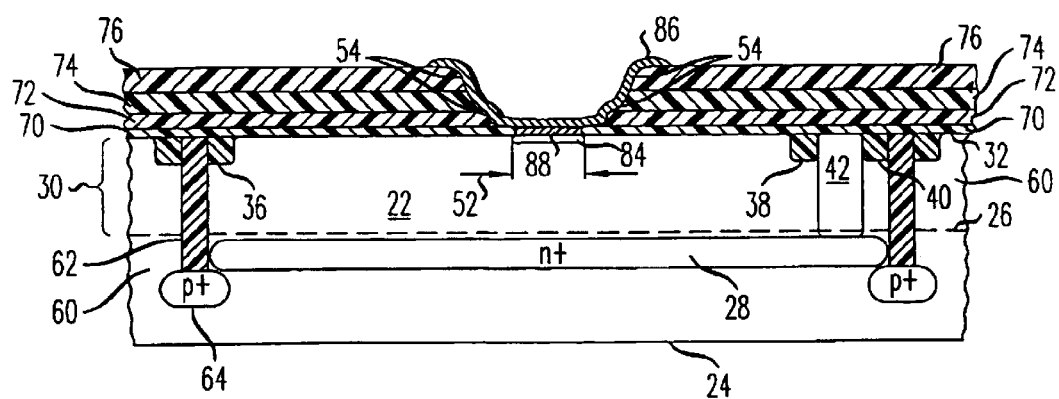
Figure 7:
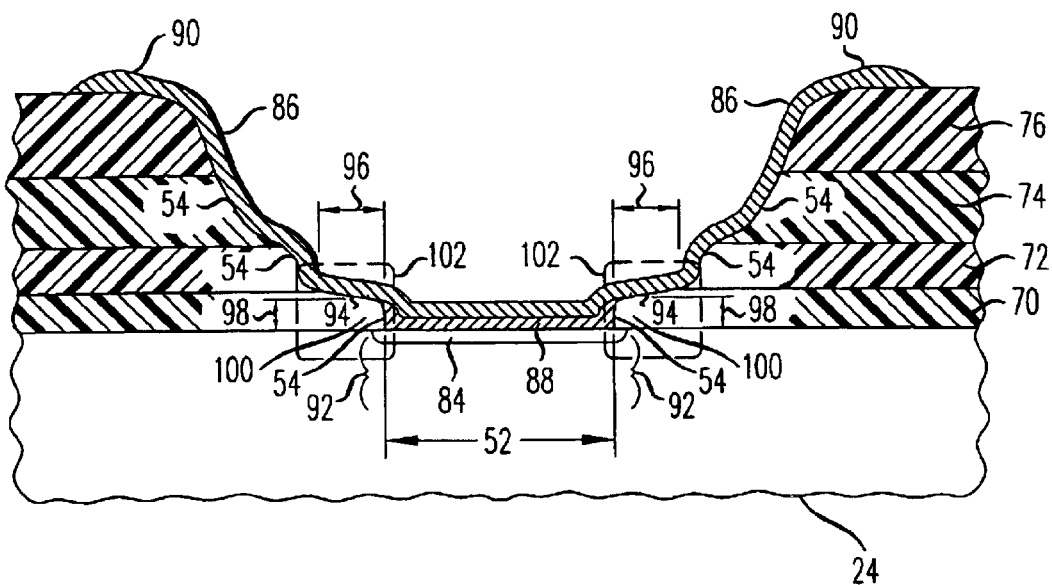
FIG. 7 is an enlarged sectional view of the Schottky contact in FIG. 6.
Figure 8:
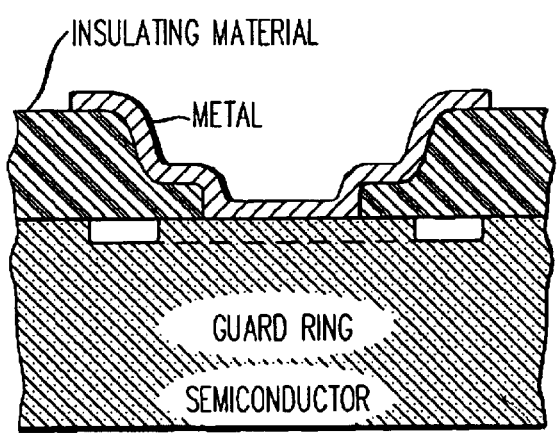
FIG. 8 is a sectional view of a prior art Schottky diode.

FIGS. 1 through 6 are a sequence of sectional views through a semiconductor substrate illustrating the steps in the method of fabricating a Schottky diode in accordance with the invention, with FIGS. 6 and 7 illustrating the resultant Schottky diode. While the Schottky diode is typically fabricated as a part of an integrated circuit, the Schottky diode may be fabricated as a discrete component.

Figure 1:
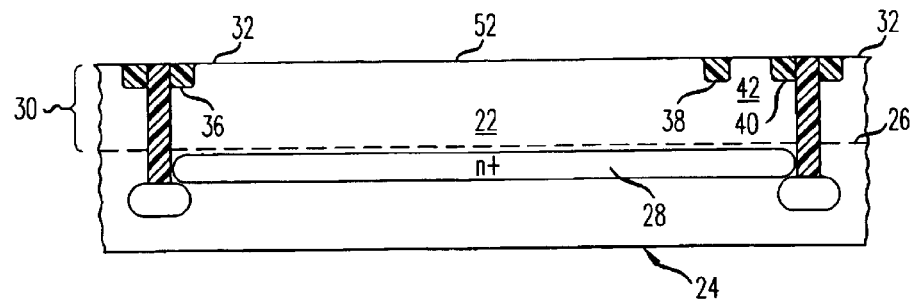
FIGS. 1 through 6 are a sequence of sectional views through a semiconductor substrate illustrating the steps in the method of fabricating a Schottky diode, in accordance with the present invention.

As shown in FIG. 1, an active area 22 in which a Schottky diode will be fabricated is developed in semiconductor substrate 24 of one conductivity type, i.e. either p-type or n-type. Semiconductor substrate 24 in a preferred embodiment is silicon, but the invention is not limited thereto. Other known semiconductor substrates, including but not limited to germanium and group III–IV compounds, may be used. The size and shape of active area 22 is dependent on the Schottky diode to be fabricated therein.

Oxide may be removed from the initial upper surface 26 of semiconductor substrate 24 such as by an etch step, as is known in the art. Not required by the invention, but when the Schottky diode is fabricated as part of an existing process to produce bipolar transistors, a dopant of a conductivity type opposite to the conductivity type of semiconductor substrate 24 is implanted over active area 22 to form a buried layer 28. An example will be described herein in which semiconductor substrate 24 is silicon of p-type conductivity and the implanted dopant is n-type such as phosphorus, arsenic, or antimony, but the invention is not limited thereto. Subsequent to the implant step, an epitaxial layer 30 of substrate material is grown of at least a sufficient thickness to meet breakdown requirements of the integrated circuit in which the Schottky diode is fabricated. The upper surface of layer 30 defines surface 32 at this point in the process. Epitaxial layer 30 becomes part of semiconductor substrate 30. In the illustrated embodiment, the epitaxial layer 30 is approximately 12,000 angstroms thick, defines surface 32 as mentioned above, and is grown by any suitable known process. Buried layer 28 formed beneath the initial upper surface 26 of semiconductor substrate 24 may diffuse into the lower portion of epitaxial layer 30.

Electrical isolation regions 36, 38, and 40 are formed by known techniques, including, but not limited to LOCOS, recessed or non-recessed poly-buffered LOCOS, shallow trench isolation, or deep trench isolation. In the illustrated embodiment, isolation region 38 is formed by a recessed poly-buffered LOCOS process, and isolation regions 36 and 40 are formed by a deep trench isolation. A photoresist layer (not shown) is patterned over surface 32 where an implant is not desired and an implant of the same conductivity type as buried layer 28 is implanted to form contact 42 within active area 22, such as between electrical isolation regions 38 and 40. Contact 42 provides electrical access to buried layer 28 from surface 32. The photoresist layer is subsequently removed. Hereinafter, the depositing, patterning, and removal of photoresist or masks will not always be discussed. One skilled in the art would know of the necessity of such steps.

Figure 2:
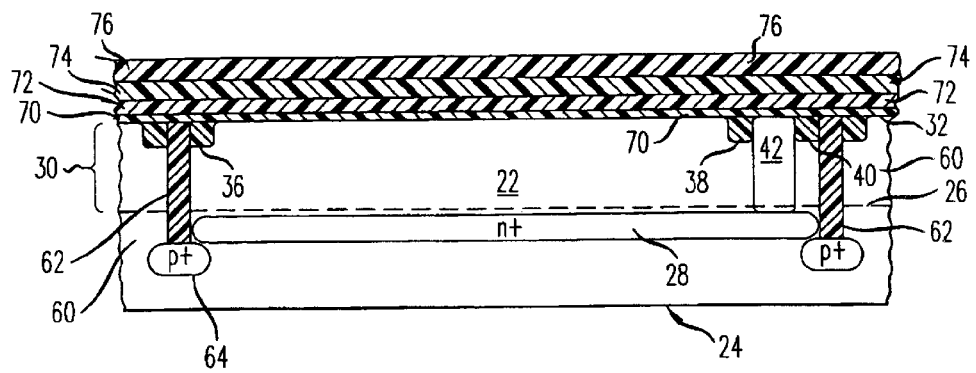

Several steps in the process are illustrated in FIG. 2. A first layer 70 of electrical insulating material, such as but not limited to silicon dioxide, silicon nitride, aluminum oxide, or combinations thereof is applied over surface 32. In the illustrated embodiment, first layer 70 of electrical insulating material is a layer of TEOS oxide applied in a blanket deposition over surface 32, is in the range of 350 to 400 angstroms thick and is applied by a low pressure chemical vapor deposition (LPCVD) process.

A second layer 72 of electrical insulating material is applied over first layer 70. In the illustrated embodiment, second layer 72 of electrical insulating material is a layer of TEOS oxide applied in a blanket deposition over first layer 70, is approximately 600 angstroms thick and is applied by a plasma enhanced chemical vapor deposition (PECVD) process. Second layer 72 is approximately twice as thick as first layer 70. The etch rate of layer 72 is greater than the etch rate of layer 70. Thus, under the same etching conditions the electrical insulating material of layer 72 will etch away more quickly than the electrical insulating material of layer 70.

Additional layers of electrical insulating material may be applied. In the illustrated embodiment, a third layer 74 of phosphorus doped oxide (PTEOS) is applied over layer 72 and is applied by a plasma enhanced chemical vapor deposition (PECVD) process. Layer 74 may be 2000 angstroms thick.

A fourth layer of electrical insulating material may be applied. In the illustrated embodiment, a fourth layer 76 of boron and phosphorus doped oxide is applied over layer 74 in a blanket deposition. Layer 76 may be thicker than layer 72 and is applied by a PECVD process. Layer 76 may be 3000 angstroms thick.

Figure 3:
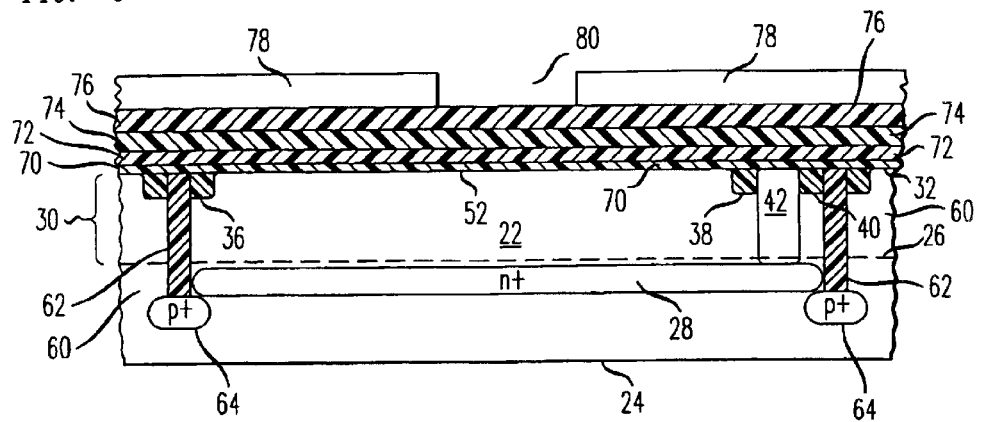

As illustrated in FIG. 3, photoresist 78 is patterned on the uppermost layer of electrical insulating material with an aperture 80 over area 52 in preparation of etching a window.

Figure 4:
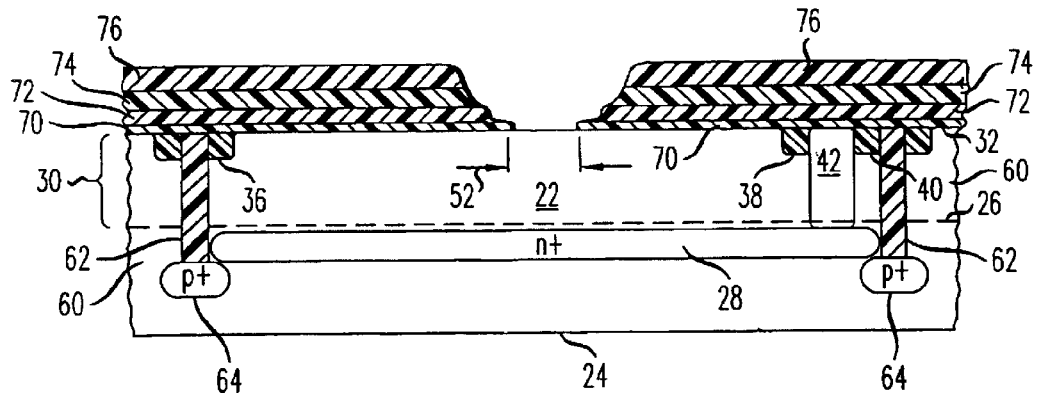
Figure 5:
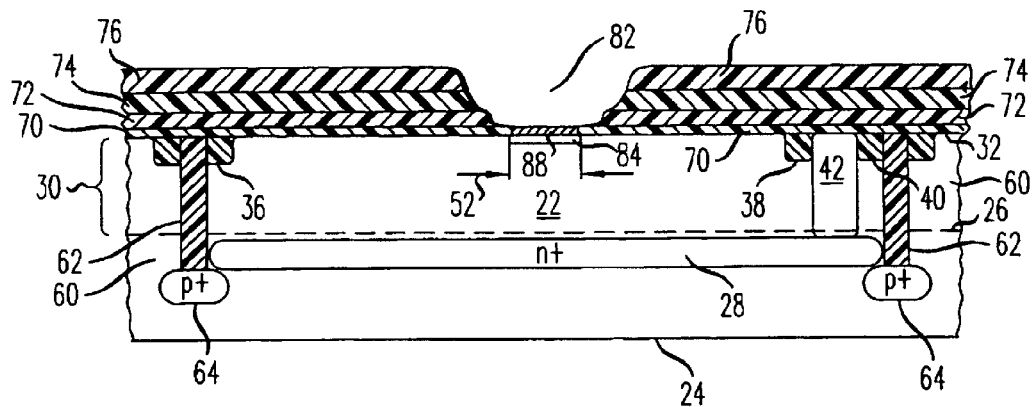

As illustrated in FIG. 4, window 82 is etched through the layers of electrical insulating material 70 and 72, as well as any other layers present such as layers 74 and 76 in the illustrated embodiment. Window 82 may be etched by any known process such as by an aqueous solution containing hydrogen fluoride or a plasma etching process with an etchant for the particular insulating materials used in the layers. Window 82 extends at least to surface 32 defining an area 52 of semiconductor substrate 24 where the semiconductor substrate is exposed due to the etch, and where the metal-semiconductor junction of the Schottky diode will be formed. Area 52 is less than the area of aperture 80 in photoresist 78. The etching solutions or plasma etching conditions and the specific electrical insulating materials are chosen to have different etching rates of the various layers of insulating material. As the etching of window 82 proceeds, the differences in etching rates provide shaping of side walls 54 of window 82 to define the final structure of window 82 at the conclusion of the etching step. The top layer of insulative material typically has an etching rate that is the same as or higher, that is etches away at least as quickly or more quickly, than the etching rate of lower layers of insulative material, which etch away more slowly, when subjected to the same etching conditions. The layer of insulative material at which a step is to be created is fabricated to have a relatively lower etching rate than the layer or layers of insulating material thereabove. In the illustrated embodiment, the top layer 76 of insulative material has the highest etching rate, that is it will etch away more quickly than the other layers of insulative material, when subjected to the same etching conditions, and layer 70 has the lowest etching rate. The relatively lower etching rate of layer 70 results in the insulative material of layer 70 being etched more slowly. Thus as window 82 is formed in an etch step, layer 70 leaves an extended portion 100 of layer 70, as well as any layer or layers of insulative material between layer 70 and substrate 24 if present, extending into the resulting window 82. One skilled in the art would know when to terminate the etch process.

As shown in FIGS. 6 and 7, the extended portion 100 extends inward in the resulting window 82, toward area 52.

The upper surface of extended portion 100 forms step 94. Extended portion 100 has a width 96 of the length layer 70 extends into window 82, and a height 98 of the thickness of layers of insulative material between surface or step 94 and substrate 24. In the illustrative embodiment, extended portion 100 has a thickness or height 98 that is either the thickness of layer 70 of insulative material, or the remaining thickness of layer 70. The length of width 96 is of sufficient size or dimension relative to the height 98 to overcome short channel effects of extended portion 100 in conjunction with metal 86 and substrate 24 operating as a MOS device.

The electrical insulating material is patterned and a silicide forming metal layer, such as but not limited to platinum, titanium, or tungsten, having a typical thickness of 150 to 400 angstroms is deposited over substrate 24, including within area 52 in window 82. A heat treatment causes the silicide forming metal to react with substrate 24 in area 52 to form silicide 84 illustrated in FIG. 5. Subsequently, the unreacted metal is etched away. The silicide is a transition metal that provides the function of defining the Schottky barrier and thus some of the characteristics of the diode.

One or more barrier layers 88 may be employed. In the illustrated embodiment, a barrier layer of titanium nitride is shown in FIG. 6. Although the barrier layer 88 of titanium nitride is not shown as extending along the side walls 54 of window 82, the invention is not so limited. Titanium nitride may be deposited by a sputtering process.

A metal layer of any known metal which will provide both a contact to the rectifying junction with the semiconductor material of semiconductor substrate 24 and its associated field plate is deposited. By way of example and not limitation, if the semiconductor substrate 24 is silicon, the metal layer may be aluminum, chromium, or rhodium; if the semiconductor substrate 24 is germanium, the metal layer may be of gold or chromium, and if the semiconductor substrate 24 is a group III–V semiconductor compound, such as gallium arsenide, the metal layer may be aluminum or gold. In the illustrated embodiment, aluminum is deposited by a sputtering deposition process.

The layer of metal (not shown) is patterned and etched to remove metal from areas where metal is not desired. A portion of the layer of metal that remains forms traces to conduct electrical energy to or from the Schottky diode. Metal 86, which forms part of the Schottky diode, remains completing the Schottky diode. One or more subsequent steps may occur. For example, a hydrogen bake may be used to passivate the surface.

Alternately, a silicide may be deposited, or a metal layer of any known metal which will provide a surface barrier rectifying junction with the semiconductor material of substrate 24 is deposited. In this case the Schottky barrier metal and the field plate are one and the same, reducing the number of steps.

FIG. 7 is an enlarged sectional view of the Schottky contact of FIG. 6. Metal 86 when deposited over the insulative material of various layers conforms to the topography of the substrate 24 in area 52 or any barrier layer 88 present, as well as insulative material along side walls 54 in window 82. Metal 86 is the region 90 may extend onto the surface of the uppermost layer 76 of insulative material, as is known in the art. When window 82 is etched, a step 94 occurs, typically between two layers of insulative material. In the illustrative embodiment, step 94 occurs between layers 70 and 72, such as substantially at the interface thereof, leaving an extended portion 100 of insulative material of layer 70 around the periphery of area 52. Extended portion 100 is formed of layer 70 and any layers of insulative material between where the step occurs and substrate 24. Extended portion 100 may comprise more than one layer of insulative material when the step occurs at a layer interface above the interface of the first layer of insulative material on substrate 24 (layer 70) and the second layer of insulative material on substrate 24. The upper most layer of insulative material forming extended portion 100 may be reduced in thickness, evenly or unevenly, due to etching.

In the illustrated embodiment, in the region of the interface of the first layer of insulative material 70 and second layer of insulative material 72 a stepped region 94 is formed around area 52. The insulating material has stepped thicknesses from an outer region more distant from area 52, formed by layer 72 and any other layers thereabove, that is thicker, to an inner region, formed by layer 70, near area 52 or silicide 84 that is thinner. The stepped thicknesses are due to differing etch rates of the materials of the various layers 70 and 72 as well as any other layers of insulating material that may be present, such as layers 74 and 76. The stepped topography of the side walls 54 of window 82 of the first and second layers of insulative material is achieved in a single etch step as a result of second layer of insulative material 72 having a greater etch rate than the etch rate of first layer of insulative material 70. Depending on the relative etching rates of insulative material in the various layers, a step 94 can selectively be achieved at the interface of layers 70 and 72, at the interface of layers 72 and 74, or at the interface of layers 74 and 76.

In the illustrated embodiment, the width 96 of extended portion 100 forming step 94 of the first layer of insulative material is approximately 1000 angstroms, and concomitantly, metal 86 over extended portion 100 is also approximately 1000 angstroms. The length of width 96 is of sufficient size or dimension relative to the height 98 to overcome short channel effects of extended portion 100 in conjunction with metal 86 and substrate 24 operating as a MOS device. It is not the dimensions of extended portion 100, by themselves, that are important. Rather a resulting structure 102, of metal 86 on step 94 separated from substrate 24 by an insulating material, forming and functioning as an MOS device such that when the Schottky diode is reverse biased, the stepped structure, which is a metal oxide semiconductor depletes or inverts the silicon region 92 beneath step 94, depending on the surface conditions, the thin insulative layer region of extended portion 100, and the bias applied, thereby controlling pinching and cornering effects in the depletion region. As a result, the Schottky diode has very low leakage reverse bias characteristics, and breakdown of the Schottky diode occurs when the reverse bias exceeds the breakdown of the insulative material.

While the invention has not been described as being useful with a guard ring, use of a guard ring with the Schottky diode is contemplated within the scope of the invention.

What is claimed is:

1. A method of fabricating a Schottky diode, comprising the steps of:

forming a first layer of insulative material having a first etch rate over the surface of a semiconductor substrate;

forming a second layer of insulative material having a second etch rate, the second etch rate being greater than the first etch rate, over the first layer of insulative material;

etching, in a single etching step, a window through the first and second layers of insulative material to the semiconductor substrate, the window forming walls having a topology of stepped thickness of insulative material due to the etch rates differing; and depositing a metal in the etched window to form a metal-semiconductor substrate contact, the metal conforming to the topology of the walls of the etched first and second layers of insulative material in the window and the semiconductor substrate to form a stepped structure.

2. The method as recited in claim 1, wherein the step of forming a first layer of insulative material comprises forming an insulative layer having a thickness of 350 to 400 angstroms.

3. The method as recited in claim 1, wherein the step of forming a first layer of insulative material comprises forming a layer of oxide.

4. The method as recited in claim 1, wherein the step of forming a first layer of insulative material comprises forming a layer of TEOS oxide by a low pressure chemical vapor deposition process.

5. The method as recited in claim 1, wherein the step of forming a first layer of insulative material comprises forming a layer of TEOS oxide having a thickness of approximately 350 to 400 angstroms.

6. The method as recited in claim 1, wherein the step of forming a second layer of insulative material comprises forming an insulative layer having a thickness of approximately 600 angstroms.

7. The method as recited in claim 1, wherein the step of forming a second layer of insulative material comprises forming a layer of oxide.

8. The method as recited in claim 1, wherein the step of forming a second layer of insulative material comprises forming a layer of TEOS oxide by a plasma enhanced chemical vapor deposition process.

9. The method as recited in claim 1, wherein the step of forming a second layer of insulative material comprises forming a layer of TEOS oxide having a thickness of approximately 600 angstroms.

10. The method as recited in claim 1, further comprising the step of forming a third layer of insulative material over the second layer of insulative material, the etching step also etching through the third insulative layer, and the depositing step also depositing metal on walls of the etched third layer of insulative material.

11. A method as recited in claim 10, wherein forming the third layer of insulating material comprises applying the third layer of insulating material by a plasma enhanced chemical vapor deposition process.

12. A method as recited in claim 1, wherein forming the third layer of insulating material comprises applying a layer of phosphorus doped oxide.

13. The method as recited in claim 1, further comprising the step of forming a fourth layer of insulative material over the third layer of insulative material, the etching step also etching through the fourth insulative layer, and the depositing step also depositing metal on walls of the etched fourth layer of insulative material.

14. A method as recited in claim 13, wherein forming the fourth layer of insulative material comprises applying a layer of boron and phosphorus doped oxide.

15. A method as recited in claim 13, wherein forming the fourth layer of insulative material comprises applying a layer of oxide by a plasma enhanced chemical vapor deposition process.

* * * * *